(12) United States Patent
Friedman et al.

(10) Patent No.: US 10,393,805 B2
(45) Date of Patent: Aug. 27, 2019

(54) JTAG SUPPORT OVER A BROADCAST BUS IN A DISTRIBUTED MEMORY BUFFER SYSTEM

(71) Applicant: International Business Machines Corporation, Armonk, NY (US)

(72) Inventors: Logan I. Friedman, Stamford, CT (US); Nicholas S. Rolfe, Hyde Park, NY (US); Susan M. Eickhoff, Hopewell Junction, NY (US); Steven R. Carlough, Poughkeepsie, NY (US); Gary A. Van Huben, Poughkeepsie, NY (US); Markus Cebulla, Stuttgart (DE); Walter Pietschmann, Horb-Bittelbronn (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/828,466

(22) Filed: Dec. 1, 2017

(65) Prior Publication Data
US 2019/0170819 A1    Jun. 6, 2019

(51) Int. Cl.
*G01R 31/3177* (2006.01)
*G01R 31/317* (2006.01)

(52) U.S. Cl.
CPC ... *G01R 31/3177* (2013.01); *G01R 31/31723* (2013.01)

(58) Field of Classification Search
CPC .......... G01R 31/3177; G01R 31/31723; G06F 3/0679
See application file for complete search history.

(56) References Cited

U.S. PATENT DOCUMENTS

| | | | | |
|---|---|---|---|---|
| 6,115,763 | A * | 9/2000 | Douskey | G06F 11/267 710/20 |
| 7,478,299 | B2 * | 1/2009 | Brandyberry | G06F 11/2242 714/30 |
| 7,739,564 | B1 | 6/2010 | Lai et al. | |
| 10,126,362 | B2 * | 11/2018 | LeClerc | G01R 31/31724 |
| 2008/0288839 | A1 | 11/2008 | Talayssat et al. | |
| 2014/0201403 | A1 | 7/2014 | Sato et al. | |
| 2016/0099028 | A1 | 4/2016 | Lung et al. | |

* cited by examiner

*Primary Examiner* — Phung M Chung
(74) *Attorney, Agent, or Firm* — Monchai Chuaychoo

(57) ABSTRACT

A method, apparatus and system testing a plurality of semiconductor chips in a distributed memory buffer system is provided. Embodiments of the present invention recognize improvements to testing signals through the chip substrate and motherboard. This invention overloads the shared broadcast bus by using it for test purposes rather than its normal mainline function. One of the main components of this invention is the A/C chip. In test mode, the AC chip converts JTAG commands into an internal test format and sends test data over the shared broadcast bus. Each data chip determines whether the scan data is for itself or if it should ignore it. The corresponding data chip then processes the data, and if necessary sends return data back to the address and command chip, where it is converted back into JTAG format and can be seen by the tester.

20 Claims, 6 Drawing Sheets

BROADCAST BUS ENCODING:

| | BEAT 1 | | BEAT 2 | BEAT 3 | BEAT 4 | BEAT 5 | BEAT 6 | ... | BEAT 10 | COMMENT |
|---|---|---|---|---|---|---|---|---|---|---|
| BIT 0:1 | BIT 2 | BIT 3 | BIT 0:3 | BIT 0:3 | BIT 0:3 | BIT 0:3 | BIT 0:3 | BIT 0:3 | BIT 0:3 | |
| 01, 11 OR 10 | XX | | SOME MAINLINE COMMANDS REQUIRE MORE INFORMATION TO BE SENT DURING THESE BEATS | | | | | | | 502 — MAINLINE COMMANDS: IDENTIFIED BY "01" OR "11" OR "10" IN BITS 0:1 OF BEAT1. MORE DATA FOLLOWS DEPENDING ON THE TYPE OF MAINLINE COMMAND |
| 00 | 0 | X | SOME NON-MAINLINE COMMANDS REQUIRE MORE INFORMATION TO BE SENT DURING THESE BEATS | | | | | | | 504 — NON-MAINLINE COMMANDS: IDENTIFIED BY "00" IN BITS 0:1 OF BEAT1. MORE DATA FOLLOWS ON LATER BEATS DEPENDING ON THE TYPE OF NON-MAINLINE COMMAND |
| 00 | 1 | | SCAN DATA | | | | | | | 506 — INTERNAL TEST MODE (SPECIAL NON-MAINLINE): SYSTEM IS IN TEST MODE. SCAN DATA CONTAINS: DC CHIP ADDRESS, COMMAND, AND DATA |

NOTE: BITS 2:3 OF BEAT1 (LABELED AS X'S) ARE USED TO DIFFERENTIATE THE TYPE OF MAINLINE OR NON-MAINLINE COMMANDS

FIG. 5

JTAG SUPPORT OVER A BROADCAST BUS IN A DISTRIBUTED MEMORY BUFFER SYSTEM

BACKGROUND OF THE INVENTION

The present invention relates generally to the field of integrate circuit manufacturing and more particularly to testing an integrated circuit using dedicated function pins in a non-dedicated function test mode.

A distributed memory refers to a multiprocessor computer system in which each processor has its own private memory. Computational tasks can only operate on local data, and if remote data is required, the computational task must communicate with one or more remote processors. Memory devices (e.g., NVRAM, DRAM, etc.) are a type of integrated circuit (IC) that can be used to store data.

Traditionally, IC devices have been tested using automated test equipment (ATE) where the IC pins being used exclusively for dedicated function testing. Joint Test Action Group (JTAG) protocol and JTAG Testing Access Port (TAP) is used for testing of IC chips after manufacturing. Therefore, most IC chips have JTAG TAP support.

In a distributed memory buffer system consisting of an address and command chip and multiple data chips, all chips must have some method of testing to ensure proper functionality. However, it can be difficult when there is not enough space for a JTAG TAP on each chip. When the chips are pin constrained, it becomes a more difficult task.

Hence, there exists a need to improve circuit testing in a distributed memory buffer system using JTAG methods and equipment.

SUMMARY

According to an embodiment, a method for testing a plurality of semiconductor chips in a distributed memory buffer system, the method comprising: receiving a Joint Test Action Group (JTAG) command from a test server; determining whether the JTAG command is a test request; responsive to determining the JTAG command is a test request, translating the JTAG command into a test command; determining whether the test command is for one or more data chips or for an Address/Command (AC) chip; responsive to determining the test command is for the AC chip, executing the test command; responsive to determining the test command is for the one or more data chips, sending the test command towards the one or more data chips; receiving a response to the test command; translating the response into a JTAG compliant response; and sending the JTAG compliant response to the test server.

According to another embodiment, a system for testing a plurality of semiconductor chips in a distributed memory buffer system, the system comprising; an Address/Command (AC) chip; a Joint Test Action Group (JTAG) Test Access Port (TAP) controller disposed in the AC chip; a JTAG internal test converter disposed in the AC chip; a mainline logic disposed in the AC chip; a JTAG test port connected to the AC chip; a shared broadcast bus connected to the AC chip; a return open drain line connected to the AC chip; one or more data chips connected to the shared broadcast bus and the return open drain line; a JTAG Automated Test Equipment (ATE) connected to the JTAG test port; and a test server connected to the JTAG automatic test equipment over a network.

According to another embodiment, An apparatus for testing a plurality of semiconductor chips in a distributed memory buffer system, the apparatus comprising; an Address/Command (AC) chip; a Joint Test Action Group (JTAG) Test Access Port (TAP) controller disposed in the AC chip; a JTAG internal test converter disposed in the AC chip; a mainline logic disposed in the AC chip; a JTAG test port connected to the AC chip; a shared broadcast bus connected to the AC chip; and a return open drain line connected to the AC chip.

BRIEF DESCRIPTION OF THE DRAWINGS

FIG. 5 is a table of commands used during JTAG testing in accordance with an embodiment of the present invention.

DETAILED DESCRIPTION

Embodiments of the present invention recognize improvements to testing integrated circuits using dedicated pin functions in a distributed memory buffer system. The improvements includes the ability for the invention to overload the shared broadcast bus (from the address and command chip to all of the data chips) by using it for test purposes rather than its normal mainline function. Improvements include various components such as the main component of this invention, the Address and Command (AC) chip. Additional components of the present invention are the shared broadcast bus, return line, the data chips and the distributed differential dual in-line memory module (DIMM) structure. All of these components work in tandem to improve the testing process during or after manufacturing. In the test mode, the AC chip converts JTAG commands into an internal test format and sends test data over this bus. Each data chip determines whether the scan data is for itself or if it should ignore it. The corresponding data chip then processes the data, and if necessary sends return data back to the address and command chip, where it is converted back into JTAG format and can be seen by the tester. The tester can send and receive data from any of the data chips or from the address and command chip and sees it as JTAG compliant data. This allows all chips in the system to be tested easily and simultaneously. Afterwards, the test results may be compared against pre-defined values.

Figure 1:
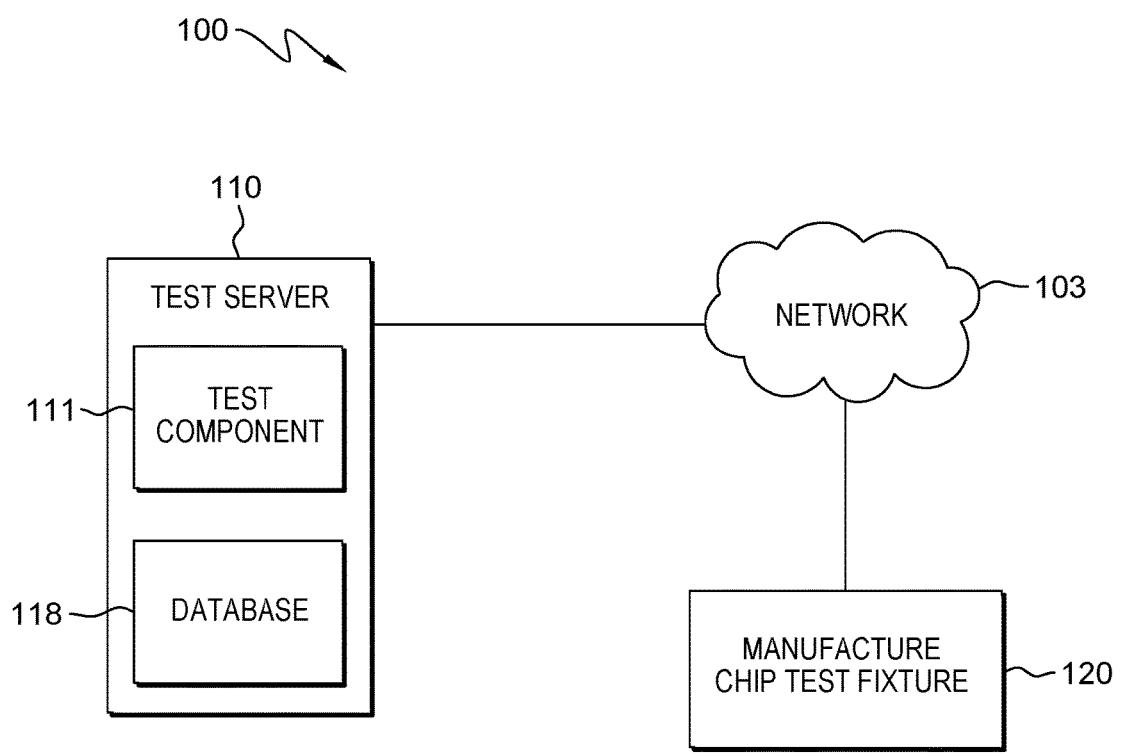
FIG. 1 is a functional block diagram JTAG testing data processing environment, designated as 100, in accordance with an embodiment of the present invention.

FIG. 1 is a functional block diagram illustrating JTAG testing data processing environment, generally designated 100, in accordance with one embodiment of the present invention. FIG. 1 provides only an illustration of one implementation and does not imply any limitations with regards to the environments in which different embodiments may be implemented. Many modifications to the depicted environment may be made by those skilled in the art without departing from the scope of the invention as recited by the claims.

JTAG testing data processing environment 100 includes test server 110 and manufacture chip test fixture 120, all interconnected over network 103. Network 103 can be, for example, a telecommunications network, a local area network (LAN), a wide area network (WAN), such as the Internet, or a combination of the three, and can include wired, wireless, or fiber optic connections. Network 103 can include one or more wired and/or wireless networks that are capable of receiving and transmitting data. In general, network 103 can be any combination of connections and protocols that will support communications between test server 110, manufacture chip test fixture 120, and other computing devices (not shown) within JTAG testing data processing environment 100.

Test server 110 can be a standalone computing device, a management server, a web server, a mobile computing device, or any other electronic device or computing system capable of receiving, sending, and processing data. In other embodiments, test server 110 can represent a server computing system utilizing multiple computers as a server system, such as in a cloud computing environment. In another embodiment, test server 110 can be a laptop computer, a tablet computer, a netbook computer, a personal computer (PC), a desktop computer, a personal digital assistant (PDA), a smart phone, or any other programmable electronic device capable of communicating with manufacture chip test fixture 120, and other computing devices (not shown) within JTAG testing data processing environment 100 via network 103. In another embodiment, test server 110 represents a computing system utilizing clustered computers and components (e.g., database server computers, application server computers, etc.) that act as a single pool of seamless resources when accessed within JTAG testing data processing environment 100. Test server 110 includes Test component 111 and database 118.

Test component 111 enables the present invention to manufacture chip test fixture 120. In the depicted embodiment, test component 111 resides on test server 110. In another embodiment, test component 111 can reside on manufacture chip test fixture 120.

Database 118 is a repository for data used by test component 111. In the depicted embodiment, database 118 resides on test server 110. In another embodiment, database 118 may reside elsewhere within JTAG testing data processing environment 100, provided that test component 111 has access to database 118. A database is an organized collection of data. Database 118 can be implemented with any type of storage device capable of storing data and configuration files that can be accessed and utilized by test server 110, such as a database server, a hard disk drive, or a flash memory. Database 118 uses one or more of a plurality of techniques known in the art to store a plurality of information regarding testing runs. For example, database 118 may store information about JTAG commands and test results.

Manufacture chip test fixture 120 enables the present invention to test data chips using JTAG protocols in a distributed memory buffer system. In the depicted embodiment, manufacture chip test fixture 120 consists of several components (refer to FIG. 2) that works in tandem to test data chips.

Figure 2:
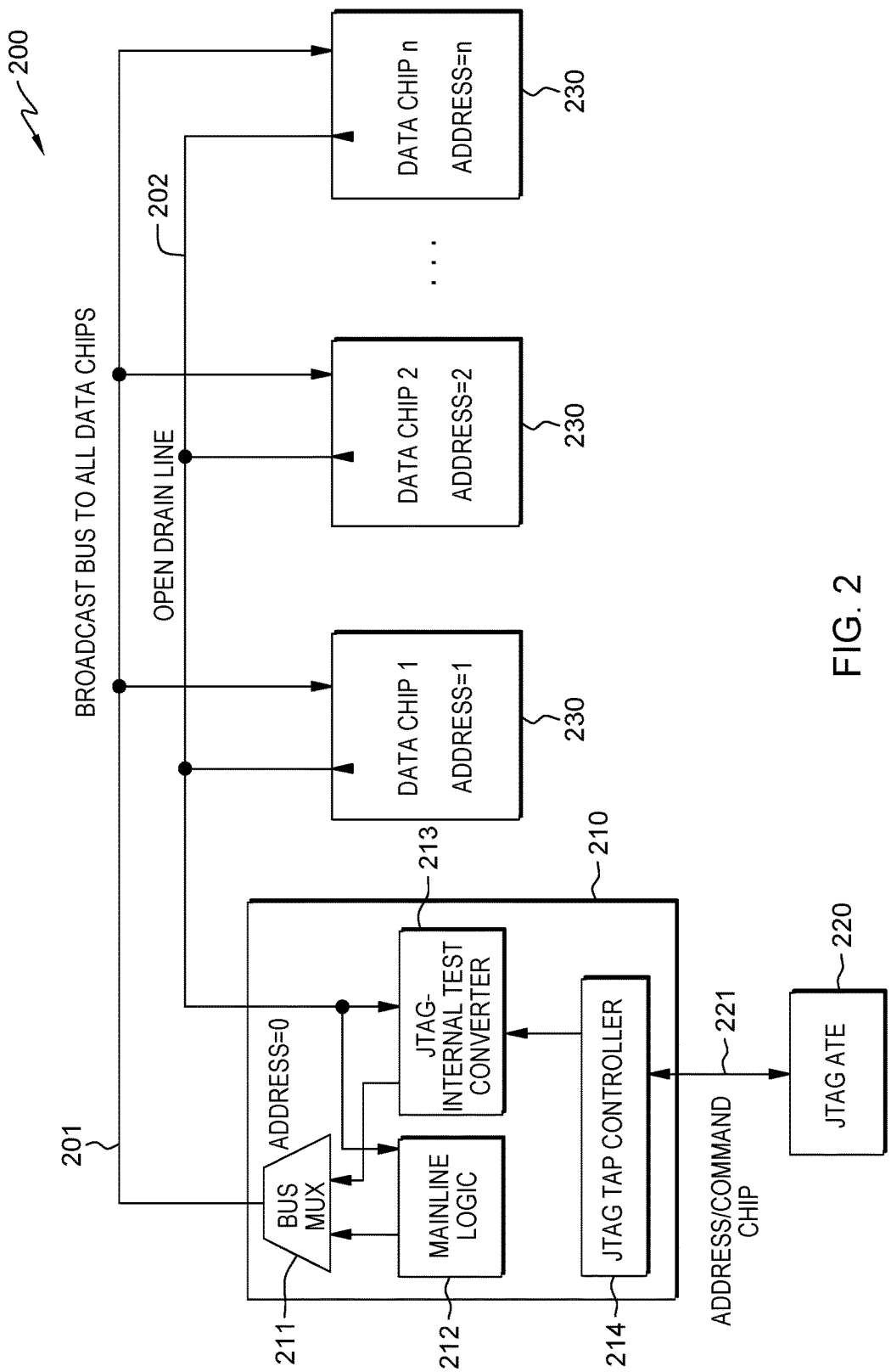
FIG. 2 is a diagram depicting components of a distributed memory buffer system, typically designated 200, in accordance with an embodiment of the present invention.

FIG. 2 is a diagram depicting components of a distributed memory buffer system, typically designated 200, in accordance with an embodiment of the present invention. The distributed memory buffer system 200 comprises of broadcast bus 201, open-drain line 202, Address and Command (AC) chip 210, bus multiplexer (mux) 211, mainline logic 212, JTAG internal test converter 213, JTAG TAP controller 214, JTAG Automated Test Equipment (ATE) 220, JTAG test port 221 and data chip 230.

Broadcast bus 201 of the present invention provides the capability for data chip 230 in the distributed memory buffer system to receive commands. For example, data chip 230 can receive commands from AC chip 210 over broadcast bus. This communication can include mainline commands (for normal memory functions) and non-mainline commands (including register operations and internal test mode). In an embodiment, broadcast bus 201 may allow one or more bits of communication to only the targeted data chip or all data chips 230 connected to broadcast bus 201. It is noted that broadcast bus 201 is a one-way communication from AC chip to the one or more data chips 230.

In an embodiment, AC chip 210 utilizes broadcast bus 201 to send commands, data and addresses to all of the data chips attached. For example, during mainline mode, AC chip 210 send commands and addresses over broadcast bus 201 for regular memory functions. In another embodiment, during internal test mode, AC chip 210 utilizes the internal test format rather than its normal mainline functionality to serially send commands, data and addresses over broadcast bus 201. For example, AC chip 210 can send a test command through broadcast bus 201 to data chip 230 to check on the integrity of the data chip 230. It is further noted that there are benefits to be gain by broadcasting an internal test command to all data chips 230 simultaneously. For example, during a certain step of JTAG based manufacturing test where registers in the targets must be initialized before some test step can execute. All data chips 230 can be programmed with the same value where it would be tedious to program sequentially.

Open-drain line 202 of the present invention provides the capability to AC chip 210 to receive communication from data chip 230 on a line. In an embodiment, in test mode, AC chip 210 may receive data back through open-drain line 202 from the attached data chips. However, it is possible during test mode that not all data chips 230 will send a return or an acknowledgement response to AC chip 210. In another embodiment, during normal memory function, AC chip 210 may receive alerts back through open-drain line 202 from the attached data chips 230. In the current embodiment, it is noted that open-drain line 202 may allow one bit of communication from the targeted addresses due to the single bit nature of the wire and open-drain line 202 allows one-way communication.

JTAG TAP controller 214, of the present invention determines whether a command sent through JTAG test port 221 is for AC chip 210 or data chip 230. In an embodiment, JTAG TAP controller 214 translates an incoming JTAG command and determines whether the command is for the AC chip or data chip 230. For example, if the command is for AC chip 210 then JTAG TAP controller 214 will execute the command. However, if the command is not for AC chip 210 then JTAG TAP controller 214 will forward it to JTAG internal test converter 213 where the command will be translated or decoded and sent to data chips 230.

JTAG test port 221 of the present invention provides the communication service between AC chip 210 and JTAG ATE 220. In an embodiment, JTAG test port 221 allows a AC chip 210 to communicate to test server 110 through JTAG ATE 220.

JTAG ATE 220 of the present invention provides the capability to provide a point of attachment for a communication port, JTAG test port 221, to test server 110. In an embodiment, JTAG ATE 220 can be the point of attachment for the entire distributed memory buffer system. For example, in a distributed memory buffer system consisting of one address and command chip (AC) and multiple data chips, it is possible to have one or more JTAG ATE 220 for the entire distributed system. In another embodiment, JTAG ATE 220 may utilize IEEE 1149.1 standard.

AC chip 210 of the present invention manages and controls the communication between test server 110 and data chips 230. In an embodiment, AC chip 210 comprises of mainline logic 212 and JTAG internal test converter 213 and JTAG TAP controller 214. In addition, AC chip 210 contains the communication port, JTAG test port 221 which is used by JTAG ATE 220. Inside AC chip 210, logic exists in JTAG internal test converter 213 to convert the JTAG commands into internal test format and vice versa, making it appear that JTAG protocol is used to test all chips. It is noted that a memory agnostic protocol for memory scheduling and control such as OpenCAPI may be appropriate in this invention.

Mainline logic 212 of the present invention manages the non-test mode commands in a distributed memory buffer system. In an embodiment, mainline logic 212 consists of providing a typical normal memory function between AC chip 210 and data chip 230 and between AC chip and memory.

JTAG internal test converter 213 of the present invention provides the capability to convert JTAG command into an internal test format. In an embodiment, JTAG commands received by JTAG internal test converter 213 through JTAG test port 221 are converted into an internal test format to be sent to data chips 230.

Bus mux 211 of the present invention provides the capability to switch or route communication between JTAG internal test converter 213 and mainline logic 212. In an embodiment, bus mux 211 can send non-test commands or test commands depending on the mode of operation. For example, for testing purposes, bus mux 211 will allow communication from JTAG internal test converter 213 to broadcast bus 201 (bound for data chips 230).

Data chips 230 of the present invention are the targeted chips for testing purposes. These are data chips are very similar in terms of functionally to the ones that exist in a typical distributed memory buffer system. However, the data chips in the present invention have been modified and contain a unique built-in logic which will be discussed further below. The advantage of modifying the data chips instead of using differential DIMM structures is due to the pin constraints. In an embodiment, one or more data chips 230 are queried by JTAG commands to ensure functionality and reliability after manufacturing. Furthermore, data chips 230 may contain built-in logic that allows it to decode commands sent to it from AC chip 210. For example, data chips 230 can send acknowledgment that it received a command via open-drain line 202 or data chip 230 can send return data based on the WRITE/READ command. In another example, each data chip 230 has the ability to distinguish the broadcast command destined for itself or from other data chips 230 (i.e., command destination is to the first data chip or for all data chips).

Figure 3:
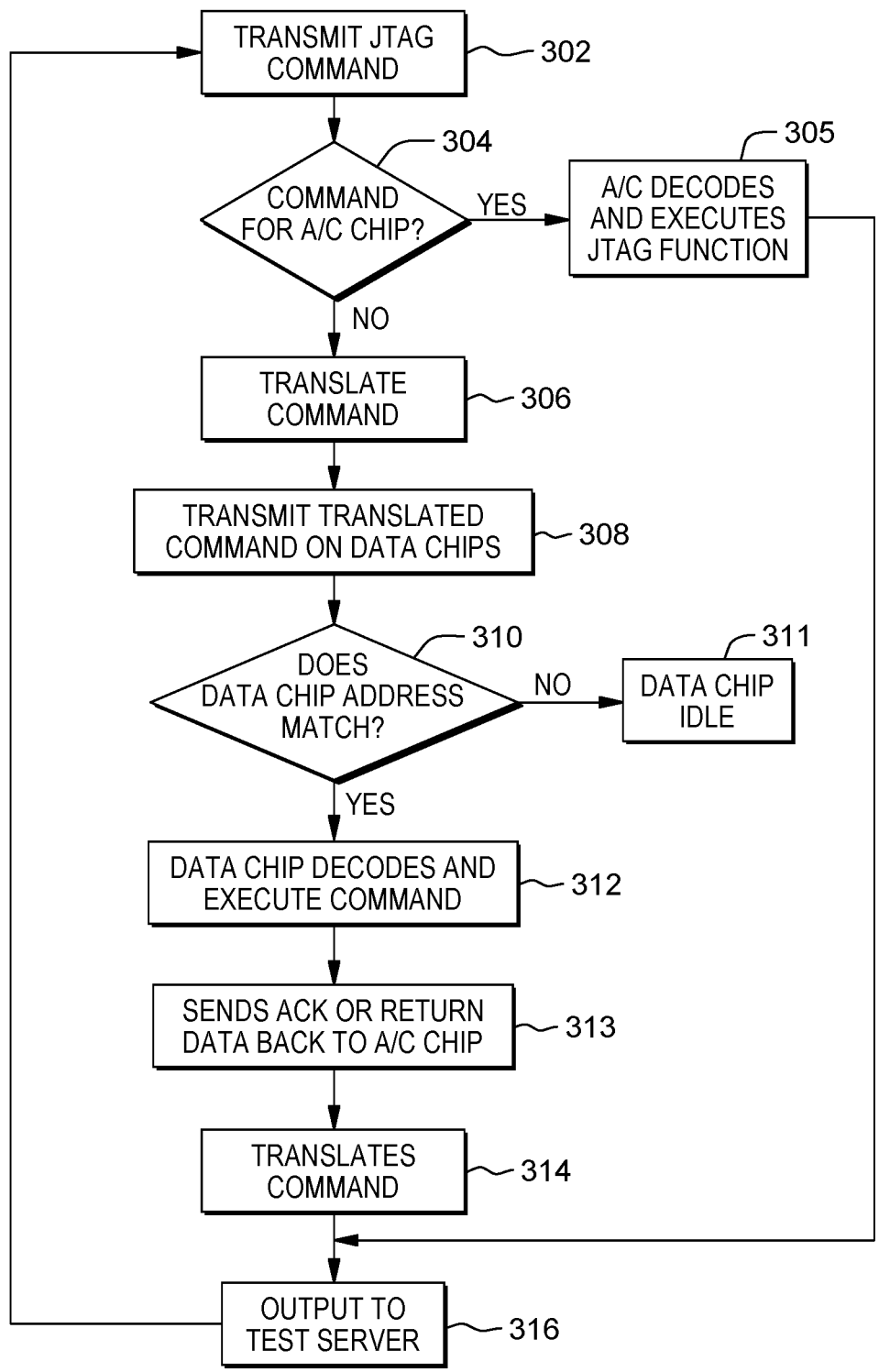
FIG. 3 is a flowchart depicting operational steps of a JTAG testing, designated as 300, in accordance with an embodiment of the present invention.

FIG. 3 is flowchart depicting operational steps of a JTAG testing in accordance with an embodiment of the present invention.

Test component 111 sends JTAG command to manufacture chip test fixture 120 (step 302). In an embodiment, test component 111 starts the testing sequence by sending the JTAG command through the JTAG ATE 220.

JTAG TAP controller 214 determines whether the command is for AC chip 210 (decision block 304) or data chip 230. In an embodiment, JTAG TAP controller 214 determines whether the commands are for testing AC chip 210 or for data chip 230 and what type of test functionality. If JTAG TAP controller 214 determines the command is for testing ("NO" branch, decision block 304) data chip 230 then AC chip 210 through JTAG internal test converter 213 proceeds to translate (step 306) the command. If JTAG TAP controller 214 determines the command is for testing the AC chip 210 ("YES" branch, decision block 304) then AC chip 210 through JTAG TAP controller 214 proceeds to decode and execute the command (step 305).

AC chip 210 through JTAG TAP controller decodes and executes the JTAG command for AC chip 210 (step 305). In an embodiment, AC chip 210 decodes and executes JTAG command and returns the result of the executed (i.e., data, etc.) JTAG command back to test server 110 (step 316).

JTAG internal test converter 213 translates the JTAG command for data chip 230 (step 306). In an embodiment, JTAG internal test converter 213 translates the JTAG command into a test protocol (see table of FIG. 5) that can be deciphered by the targeted data chip 230. For example, using decoded command according to the table of FIG. 5, JTAG internal test converter 213 is able to translate the JTAG command. It is noted that due to pin constraints on the data chips 230, it is necessary to convert the JTAG commands into an internal test format to scan data to and from the data chips 230 over broadcast bus 201.

JTAG internal test converter 213 sends the translated JTAG command to data chips 230 (step 308). In an embodiment, JTAG internal test converter 213 through bus mux 211 and broadcast bus 201 sends the translated chip protocol (from step 306) to the plurality of data chip 230. It is noted that each data chip 230 has a unique address from other data chip 230.

Data chip 230 determines whether its address matches the received command (decision block 310). If data chip 230 determines that it did receive the data intended for itself based on the matching address ("YES" branch, decision block 310) then data chip 230 decodes and executes the JTAG command (step 312). If data chip 230 determines that it did not receive the command ("NO" branch, decision block 310) then data chip 230 idles or does nothing (step 311).

Data chip 230 decodes and executes the command (step 312). In an embodiment, data chip 230 decodes and executes the JTAG command. For example, the command can be a for a WRITE operation. In another example, the command can be a WRITE/READ operation.

Data chip 230 sends either an acknowledgment or returns data to AC chip 210 (step 313). In one embodiment, data chip 230 sends an acknowledgement through open drain line 202 to AC chip 210 based on the test command. For example, data chip 230, with the correct address accepts the command and responds with an acknowledgement back to AC chip 210. It is possible that some test commands do not require a return data set. For example, a WRITE operation for data chip 230 only requires an acknowledgement of the command not the content of the WRITE operation. Furthermore, data chip 230 enables its driver for the open drain line and sends an acknowledgement to AC chip 210.

AC chip 210 translates the acknowledgement and data into JTAG format (step 314). In an embodiment, AC chip 210 translates the response from the one or more data chips 230 into a readable format. The response could be an acknowledgement from data chips or a returned data. If there is data returned from the one or more data chips 230 then AC chip 210 translates the data back into a JTAG format.

In another embodiment, data chip 230 send data back to AC chip 210 based on the test command. If the action requires return data (i.e., READ), data chip 230 enables its driver for the open drain line and sends data back to AC chip 210. It is noted that open drain line 202 contains a one-bit attention line from data chips back to AC chip 210.

AC chip 210 outputs the result back to test server 110 (step 316). In an embodiment, AC chip 210 translates the return data from open-drain line 202 and stores that results in database 118. The data can be converted back to JTAG and can be read out on the JTAG ATE 220. The next data chip 230 can be accessed and data returned in the same manner as the first data chip 230. The tester would then see the scan out data in the order of the accesses. Having one JTAG ATE 220 allows the tester more flexibility while still being JTAG compliant. AC chip 210 would be in JTAG mode while the data chips would not need to be since there are not individual JTAG TAPs on each one.

Figure 4:
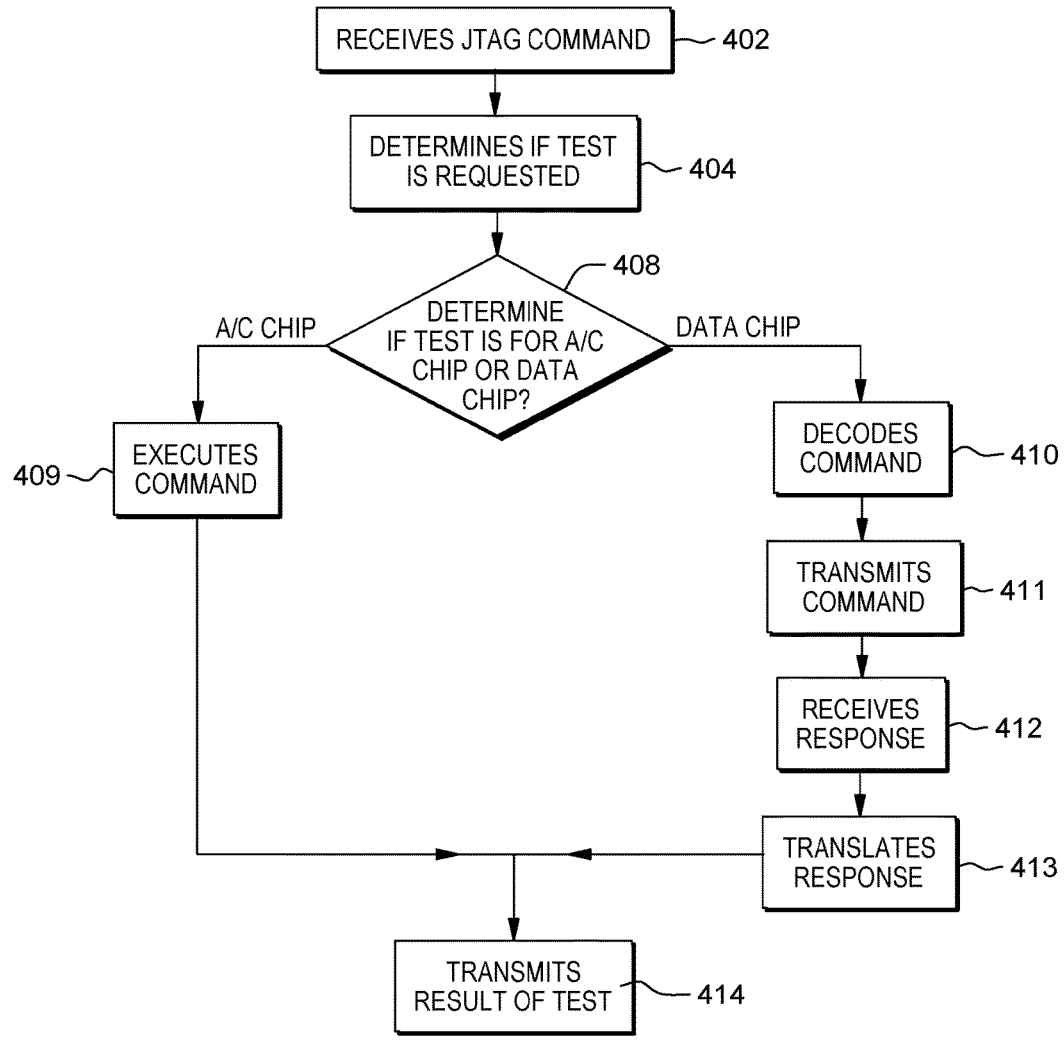
FIG. 4 is a high-level flowchart, designated as 400, depicting operational steps of a JTAG testing in accordance with another embodiment of the present invention.

FIG. 4 is a high-level flowchart, designated as 400, depicting operational steps of a JTAG testing in accordance with another embodiment of the present invention. This flowchart is from the perspective of AC chip 210.

AC chip 210 receives a JTAG command (step 402). In an embodiment, AC chip receives a JTAG command from test server 110.

AC chip 210 determines if a test is requested (step 404). In an embodiment, AC chip 210 determines whether the JTAG command is for normal operation or for testing the distributed memory buffer system.

AC chip 210 determines whether the test command is for AC chip 210 or the one or more data chips 230 (decision block 408). In an embodiment, AC chip 210 determines whether the test command is for AC chip 210 or needs to be forwarded to the one or more data chips. In an embodiment, AC chip 210 determines whether a test request is for itself or for the one or more data chips 230.

AC chip 210 executes the command (step 409). In an embodiment, AC chip 210 determines that the command is for AC chip 210 ("AC CHIP", branch of decision block 408) then AC chip 210 executes the command.

AC chip 210 decodes JTAG command (step 410). In an embodiment, AC chip 210, after determining that the test command is for the one or more data chips 230 ("DATA CHIP", branch of decision block 408), AC chip 210 translates the JTAG command into an internal test command based on a decoding table (see FIG. 5).

AC chip 210 transmits the command (step 411). In an embodiment, after translating the command (step 410), AC chip 210 transmit the command to the one or more data chips 230.

AC chip 210 receives a response (step 412). In an embodiment, AC chip 210 receives a response from data chip 230. In another embodiment, AC chip 210 receives a response by the way of open drain line 202.

AC chip 210 translates the response (step 413). In an embodiment, AC chip 210 translates the response from the one or more data chips 230 into a readable format. The response could be an acknowledgement from data chips or a returned data. If there is data returned from the one or more data chips 230 then AC chip 210 translates the data back into a JTAG format.

AC chip 210 transmits test result (step 414). In an embodiment, AC chip 210 transmits the test result to test server 110.

FIG. 5 is table of translated mainline commands used during JTAG testing in accordance with an embodiment of the present invention. The table illustrates the bits used by the broadcast bus for either mainline command 502, non-mainline command 504 or internal test mode 506. Mainline command 502 is the normal functioning mode. The host sends different types of memory commands. These are normally data access operations to the attached memory or storage elements. Non-mainline command 504 is used to set up configuration information and to access registers which store vital information. Internal test mode 506 used while testing the distributed memory buffer system which is the main topic discussed in the present invention. It is noted that a "beat" is one cycle of a typical command set. For example, broadcast bus 201 is only four (4) bits and one bit for parity error detection, and some commands can be lengthy and can require multiple cycles to send over the entire command set. Therefore, a "beat" is one entire section of the command. For example, if the command were 16 bits long, then it would take four (4) beats to send over the entire command.

Figure 6:
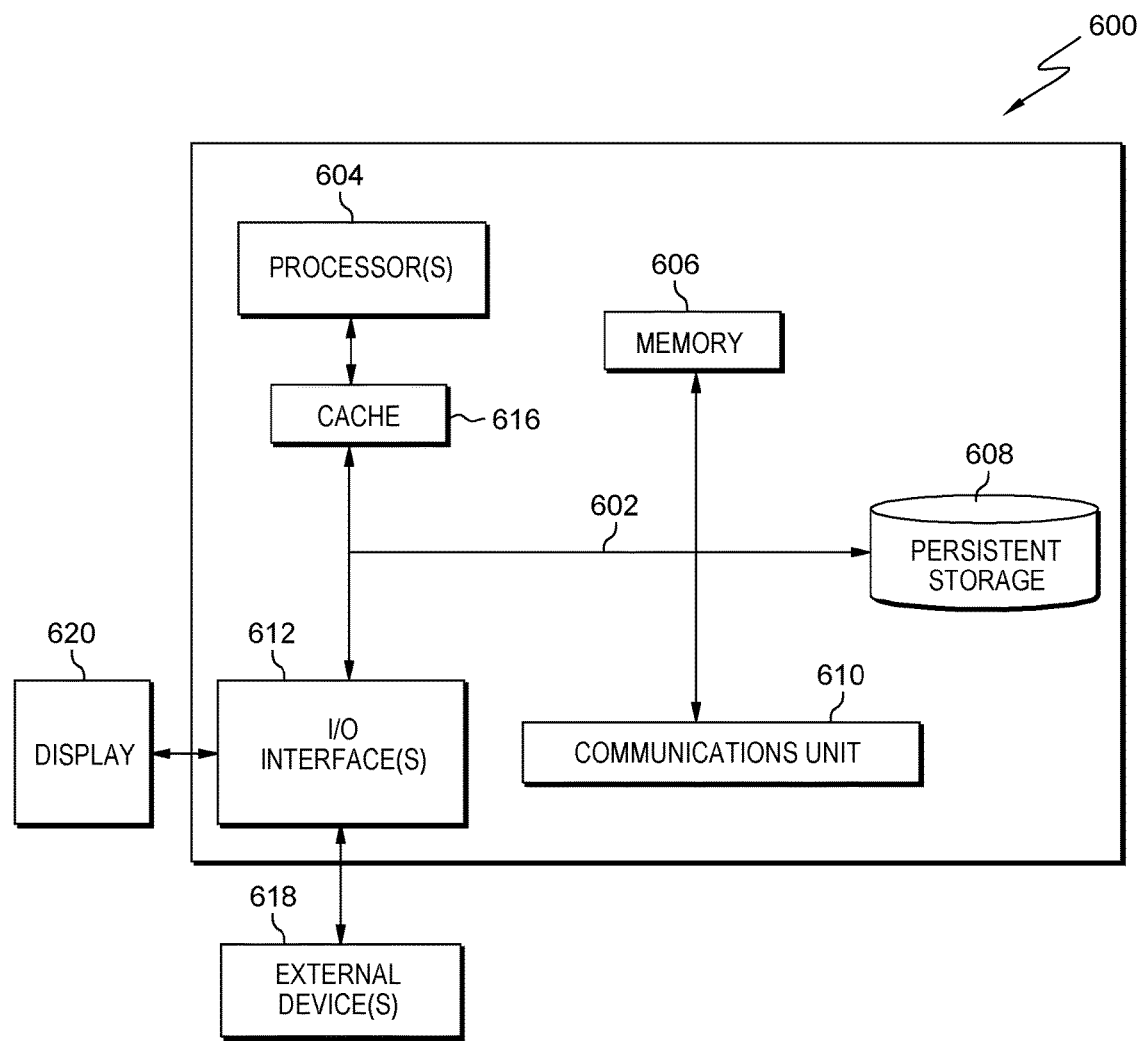
FIG. 6 depicts a block diagram 600 of components of the server computer executing the program within the JTAG data processing environment of FIG. 1, in accordance with an embodiment of the present invention.

FIG. 6 depicts a block diagram of components of test server 110 within JTAG testing data processing environment of FIG. 1, in accordance with an embodiment of the present invention. It should be appreciated that FIG. 6 provides only an illustration of one implementation and does not imply any limitations with regard to the environments in which different embodiments can be implemented. Many modifications to the depicted environment can be made.

Test server 110 can include processor(s) 604, cache 616, memory 606, persistent storage 608, communications unit 610, input/output (I/O) interface(s) 612 and communications fabric 602. Communications fabric 602 provides communications between cache 616, memory 606, persistent storage 608, communications unit 610, and input/output (I/O) interface(s) 612. Communications fabric 602 can be implemented with any architecture designed for passing data and/or control information between processors (such as microprocessors, communications and network processors, etc.), system memory, peripheral devices, and any other hardware components within a system. For example, communications fabric 602 can be implemented with one or more buses.

Memory 606 and persistent storage 608 are computer readable storage media. In this embodiment, memory 606 includes random access memory (RAM). In general, memory 606 can include any suitable volatile or non-volatile computer readable storage media. Cache 616 is a fast memory that enhances the performance of processor(s) 604 by holding recently accessed data, and data near recently accessed data, from memory 606.

Program instructions and data used to practice embodiments of the present invention, e.g., test component 111 and database 118, can be stored in persistent storage 608 for execution and/or access by one or more of the respective processor(s) 604 of test server 110 via memory 606. In this embodiment, persistent storage 608 includes a magnetic hard disk drive. Alternatively, or in addition to a magnetic hard disk drive, persistent storage 608 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 608 may also be removable. For example, a removable hard drive may be used for persistent storage 608. Other examples include optical and magnetic disks, thumb drives, and smart cards that are inserted into a drive for transfer onto another computer readable storage medium that is also part of persistent storage 608.

Communications unit 610, in these examples, provides for communications with other data processing systems or devices, including resources of manufacture chip test fixture 120. In these examples, communications unit 610 includes one or more network interface cards. Communications unit 610 may provide communications through the use of either or both physical and wireless communications links. Test component 111 and database 118 may be downloaded to persistent storage 608 of test server 110 through communications unit 610.

I/O interface(s) 612 allows for input and output of data with other devices that may be connected to test server 110. For example, I/O interface(s) 612 may provide a connection to external device(s) 618 such as a keyboard, a keypad, a touch screen, a microphone, a digital camera, and/or some other suitable input device. External device(s) 618 can also include portable computer readable storage media such as, for example, thumb drives, portable optical or magnetic disks, and memory cards. Software and data used to practice embodiments of the present invention, e.g., test component 111 and database 118 on test server 110, can be stored on such portable computer readable storage media and can be loaded onto persistent storage 608 via I/O interface(s) 612. I/O interface(s) 612 also connect to a display 620.

Display 620 provides a mechanism to display data to a user and may be, for example, a computer monitor or the lenses of a head mounted display. Display 620 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for testing a plurality of semiconductor chips in a distributed memory buffer system, the method comprising:
   receiving a Joint Test Action Group (JTAG) command from a test server;
   determining whether the JTAG command is a test request;
   responsive to determining the JTAG command is the test request, translating the JTAG command into a test command;
   determining whether the test command is for one or more data chips or for an Address and Command (AC) chip;
   responsive to determining the test command is for the AC chip, executing the test command;
   responsive to determining the test command is for the one or more data chips, sending the test command towards the one or more data chips;
   receiving a response to the test command;
   translating the response into a JTAG compliant response; and
   sending the JTAG compliant response to the test server.

2. The method of claim 1, wherein sending the JTAG compliant response to the test server further comprises:
   routing the JTAG compliant response by a JTAG test port; and
   transmitting the response to the test server.

3. The method of claim 1, wherein receiving the JTAG command from the test server, further comprises:
   receiving the JTAG command from the test server through the JTAG Automated Test Equipment (ATE).

4. The method of claim 1, wherein determining whether the test command is for the one or more data chips or for the AC chip, further comprises:
   decoding the JTAG command by a JTAG Tap Controller.

5. The method of claim 1, wherein decoding the JTAG command into a test command, further comprises:
   translating the JTAG command by a JTAG internal test converter into an internal test mode.

6. The method of claim 1, wherein sending the test command towards the one or more data chips further comprises:
   routing the test command through a bus multiplexer to a shared broadcast bus wherein the destination address of the test command can be for a plurality of data chips.

7. The method of claim 6, wherein receiving the response from the one or more data chips, further comprises:
   detecting an enablement of an open drain line and a driver associated with a data chip wherein the data chip contains a logic to distinguish a destination address of the test command for itself or for another data chip; and
   aggregating the response from the data chip.

8. An apparatus for testing a plurality of semiconductor chips in a distributed memory buffer system, the apparatus comprising;
   an Address and Command (AC) chip;
   a Joint Test Action Group (JTAG) Test Access Port (TAP) controller disposed in the AC chip;
   a JTAG internal test converter disposed in the AC chip;
   a mainline logic disposed in the AC chip;
   a JTAG test port connected to the AC chip;
   a shared broadcast bus connected to the AC chip;
   a return open drain line connected to the AC chip; and
   one or more data chips connected to the shared broadcast bus and the return open drain line.

9. The apparatus of claim 8, wherein the JTAG TAP controller further comprises a logic for determining whether a test command is for the one or more data chips or for the AC chip.

10. The apparatus of claim 9, wherein the one or more data chips contain the logic to distinguish a destination address of the test command for a plurality of data chips.

11. The apparatus of claim 8, wherein the JTAG internal test converter comprises logic for converting a JTAG command into an internal test format.

12. The apparatus of claim 8, wherein the mainline logic comprises of logic for managing a non-test mode commands in a distributed memory buffer system.

13. The apparatus of claim 8, wherein the shared broadcast bus comprises one or more bits of pathway for a one-way communication between the AC chip and the one or more data chips.

14. The apparatus of claim 8, wherein the return open drain line comprises a one bit pathway for a one-way communication between the AC chip and one or more data chips.

15. A system for testing a plurality of semiconductor chips in a distributed memory buffer system, the system comprising;

an Address and Command (AC) chip;
a Joint Test Action Group (JTAG) Test Access Port (TAP) controller disposed in the AC chip;
a JTAG internal test converter disposed in the AC chip;
a mainline logic disposed in the AC chip;
a JTAG test port connected to the AC chip;
a shared broadcast bus connected to the AC chip;
a return open drain line connected to the AC chip;
one or more data chips connected to the shared broadcast bus and the return open drain line;
a JTAG Automated Test Equipment (ATE) connected to the JTAG test port; and
a test server connected to the JTAG automatic test equipment over a network.

16. The system of claim 15, wherein the test server comprises a test component, a database and a network device.

17. The system of claim 16, wherein the database comprises a relational database for storing a test result of the AC chip and the one or more data chips.

18. The system of claim 15, wherein JTAG ATE comprises a communication pathway between the test server and the AC chip.

19. The system of claim 15, wherein the network comprises a wireless network and an Ethernet network.

20. The system of claim 15, wherein the JTAG test port comprises of a component associated with a communication service between the AC chip and the JTAG ATE.

* * * * *